(12) United States Patent
Bartlett

(10) Patent No.: US 12,038,456 B2
(45) Date of Patent: Jul. 16, 2024

(54) MULTI-USER TEST INSTRUMENT

(71) Applicant: Tektronix, Inc., Beaverton, OR (US)

(72) Inventor: Josiah A. Bartlett, Forest Grove, OR (US)

(73) Assignee: Tektronix, Inc., Beaverton, OR (US)

( * ) Notice: Subject to any disclaimer, the term of this patent is extended or adjusted under 35 U.S.C. 154(b) by 66 days.

(21) Appl. No.: 17/514,987

(22) Filed: Oct. 29, 2021

(65) Prior Publication Data

US 2022/0137091 A1 May 5, 2022

Related U.S. Application Data

(60) Provisional application No. 63/110,275, filed on Nov. 5, 2020.

(51) Int. Cl.
*G01R 31/26* (2020.01)
*G01R 1/02* (2006.01)

(52) U.S. Cl.
CPC ......... *G01R 1/025* (2013.01); *G01R 31/2601* (2013.01)

(58) Field of Classification Search
CPC ...... G01R 1/025; G01R 1/02; G01R 31/2601; G01R 31/2607; G01R 31/2642; G01R 31/26; G01R 31/31912; G01R 31/319; G06F 11/2242; G06F 11/2736; G06F 11/22; G06F 9/5038; G06F 9/50; G06F 2209/5021

See application file for complete search history.

(56) References Cited

U.S. PATENT DOCUMENTS

| | | | |
|---|---|---|---|
| 7,363,188 B1 * | 4/2008 | Olgaard | G01R 31/318307 702/121 |
| 2014/0168053 A1 * | 6/2014 | Bergsieker | G01R 1/025 345/156 |
| 2016/0034305 A1 * | 2/2016 | Shear | H04L 47/70 707/722 |

\* cited by examiner

*Primary Examiner* — Tarun Sinha
*Assistant Examiner* — James I Burris
(74) *Attorney, Agent, or Firm* — Miller Nash LLP; Andrew J. Harrington

(57) ABSTRACT

A test and measurement instrument includes one or more processors to execute code to cause the processors to: access a user instance of the test and measurement instrument; receive one or more requests from the user instance of the test and measurement instrument; determine any collisions between the one or more requests and any other requests for elements of the test and measurement instrument; resolve any collisions as necessary; perform one or more operations to fulfill the request; and display information resulting from the one or more operations on an instance user interface.

20 Claims, 3 Drawing Sheets

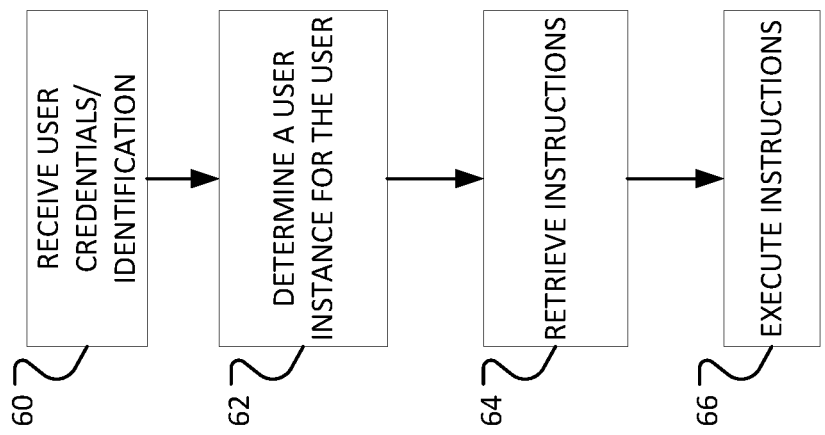
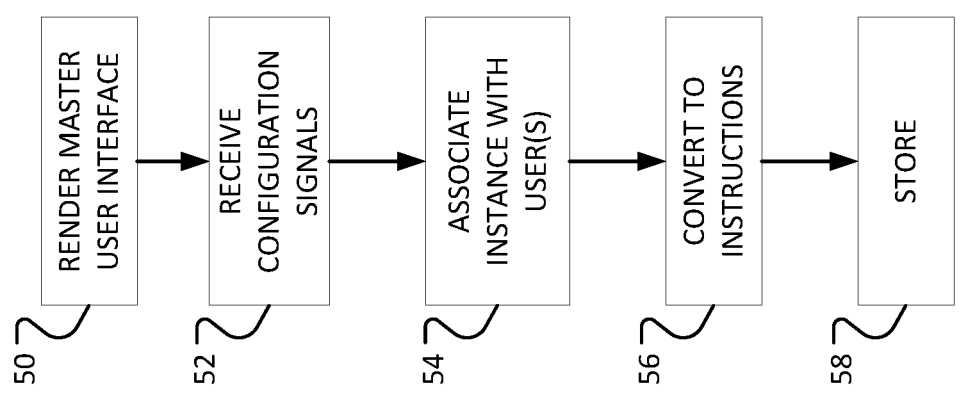

MULTI-USER TEST INSTRUMENT

PRIORITY

This disclosure claims benefit of U.S. Provisional Application No. 63/110,275, titled "MULTI-USER TEST INSTRUMENT," filed on Nov. 5, 2020, the disclosure of which is incorporated herein by reference in its entirety.

TECHNICAL FIELD

This disclosure relates to test and measurement instruments, and more particularly to systems and methods for operating a test and measurement instrument.

BACKGROUND

Test and measurement instruments, such as an oscilloscope, are often used to measure signals from a device under test (DUT). Sometimes a DUT needs to be tested or measured in a location having limited physical space, such as inside of a temperature chamber for testing performance of the DUT at elevated and/or lowered temperatures. Often multiple users of multiple disciplines may need to use the test equipment and/or the DUT. For example, one engineer may be responsible for design and validation testing of a particular portion of the DUT's circuitry, while another engineer may be responsible for design and validation of a different portion of the DUT. However, the number of DUTs may be limited, for example in a small prototype build of a DUT. Additionally, the number of test instruments may be limited since test instruments are typically expensive capital equipment. For the example of temperature testing, even with multiple test instruments available, there may be limited power available in the chamber, or there may be limited space to install test equipment within a useful distance of the DUT.

Therefore, engineering teams are often required to time-share test instruments and/or DUTs to perform their necessary design validation tasks serially, which increases the total time for completing validation. When the engineering teams have to time-share test equipment, they often need reconfigure it. For example, they may need to change the connections from test instrument inputs to different particular test points on the DUT, change instrument settings to perform a different type of measurement, change data storage locations, etc. When the test instrument and/or DUT resides in an area like a temperature chamber, difficulties may occur in physically accessing the DUT and/or the instrument for reconfiguration. In the time-sharing paradigm, only a single user can use the test instrument, even if multiple DUTs were available.

Embodiments of the disclosed technology address these and other problems by providing a test instrument, or a set of test instruments that allows multiple users to use the instrumentation as if each user has complete control of the machine.

BRIEF DESCRIPTION OF THE DRAWINGS

FIG. 2 shows a flowchart of an embodiment of a method of resolving conflicts for resources between instances on a test and measurement instrument.

FIG. 3 shows a flowchart of an embodiment of a method of configuring a test and measurement instrument to have multiple instances.

DETAILED DESCRIPTION

The embodiments provide one or more test instruments that allow use by multiple users. The one or more test instruments may comprise a single test instrument, or a set of multiple instruments that behave as one test instrument, sometimes referred to as multi-instrument "stacks" or a conglomerate instrument, have been around for quite some time. These conglomerate stacks still only serve a single user. In contrast, embodiments of the disclosed technology enable a single or conglomerate instrument to arbitrarily sub-divide its resources such that more than one user may use the instrumentation stack in an independent manner. In other words, embodiments of the disclosure allow multiple users to "unstack" these multi-instrument stacks when needed.

As used here, the term "instrument" refers to a single instrument, a conglomerate instrument, or a multi-instrument stack, where the terms "conglomerate instrument" and "multi-instrument stacks' refer to any group of instruments that operate as a single instrument The term "instance" refers to a configuration of an instrument, which may include the DUT or DUTs. The instances may take the form of virtual machines or containers, as examples, of the instrument running on the operating system of the instrument. Each instance has its own set of resources and triggers that cause the instrument to behave in particular ways. For example, one engineer may be responsible for design and validation testing of a particular portion of the DUT's circuitry, while another engineer may be responsible for design and validation of a different portion of the device under test (DUT). Each engineer would have their own instance that generates signals, applies them to the DUT and monitors the resulting output signal from the different portions of the DUT. Other examples may involve more than one DUT. For example, one engineer may want to test one DUT, while another wants to compare functions between DUTs. The first engineer's instance will include only the first DUT as a resource, and the second engineer's instance will include two DUTs, both of which may be attached to a single instrument or different instruments in a conglomerated instrument. The instrument may be connected to the DUT or multiple DUTs directly, or with probes, digitally via a physical (PHY) interface or software abstraction layer, or with multiplexing or switching equipment such as an RF switch matrix.

Figure 1:
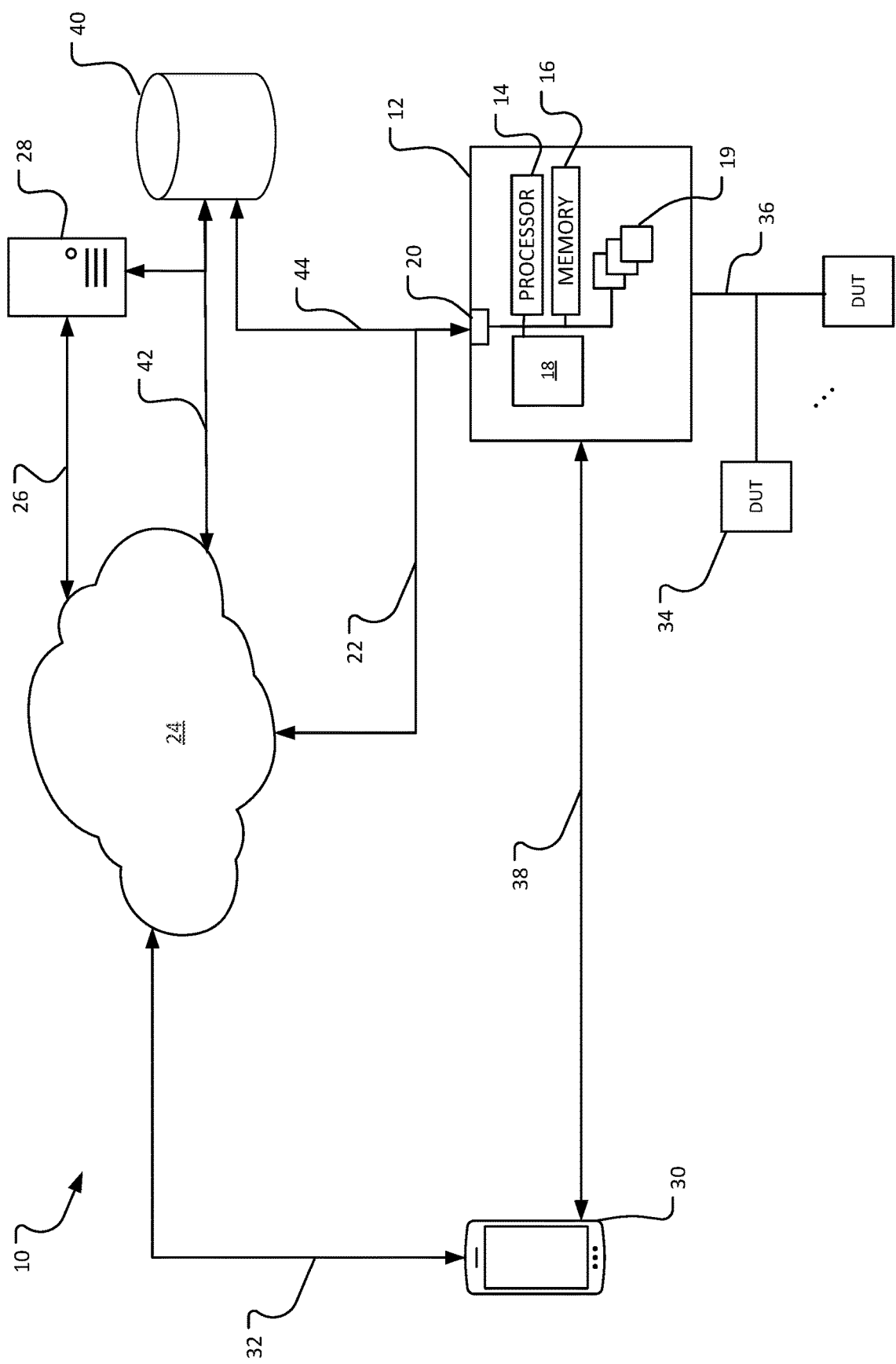
FIG. 1 shows an embodiment of a test and measurement instrument.

The embodiments involve a single test and measurement instrument, or a conglomerated test and measurement instrument that can serve multiple users in a way that allows for independent control, measurement, and manipulation of waveforms by each connected user. FIG. 1 shows an embodiment of such a system, 10. In the system 10, a test and measurement instrument 12 may comprise a lone instrument such as an oscilloscope, or a conglomerated or "multi-stack" instrument made up of several different instruments that act as one. Similarly, the processor 14 may comprise one processor or several processors, residing in one instrument, or across all instruments in a group. The memory 16 may have a similar architecture. The instrument will typically also include a display 18 accessible by "local" users, meaning those users in close proximity to the instrument. The instrument may display one of several user interfaces such as those shown at 19, discussed in more detail below.

The device has at least one port 20 that allows the instrument and the users to communicate across a network 24 through communication link 22. The communication link may comprise a wired link, such as an Ethernet cable connected to a network link, or wireless, such as Wi-Fi in accordance with IEEE standard 802.11x. At least one other communication link 36 may connect to one or more devices under test (DUT) such as 34.

In one embodiment, the system has a client-server architecture, where the instrument transfers data between the instrument 12 and the user interface(s) that may be on another device, such as a computing device, mobile phone, tablet, etc., shown as device 30 as an example. This may reduce processing load on the processor or processors in the instrument 12. The device 30 may have a "direct" connection 38, meaning not across a network, between the device and the instrument, whether wired or wireless, or a network connection 32, wired or wireless, or both.

One embodiment of the system may include a server 28 that assists with the operation, or operates, the overall system protocols, connected to the network by a connection 26. The server may have access to a storage/memory, such as a cloud-based storage remote from the test and measurement instrument, 40 that stores the execution instructions for each instance, the user authentication information, the user association to different instances, or all or any of these items. Alternatively, the instrument 12 may operate more locally, where the instrument stores any or all of these things, or the instrument has access to the storage 40, either through a direct link 44, or a network link 42. This mode of operation may operate across a network, or on direct communication links with the user devices.

Having discussed various embodiments of the overall system, the discussion can now turn to the methodology that allows multiple users to share the instrument while avoiding collisions in requests for resources within the system. As discussed above, each user can configure the instance to operate the instrument as if that user has control over the instrument. One should note that "user" may also mean a group of users that all have an interest in the particular instance, and could include an automated test system or machine learning device interface.

As mentioned above, the one or more processors of the instrument may render one of a set of user interfaces on either the instrument's display or the display of a user device. A user interface allows for master configuration of each connected user's resources, for example which channels or how much record length is available to each user. This user interface will be referred to here as the "master user interface." This interface allows the user to configure 'their' instance, providing the user with the lists of available resources, etc., and how the instrument is to perform when operating on their instance. FIG. 2 shows a flowchart of an embodiment of a method to configure an instance.

At 50, the instrument renders the master user interface on a display. As discussed above, the display may comprise a display one the instrument or may comprise a display on a user device, remote from the instrument. As the user configures the instrument through the interface, the signals are received back at the one or more instrument processors at 52. The configuration is then associated with that user, or group of users, for later retrieval at 54, converted into processor instructions for the instrument processor at 56, and then stored at 58.

The instance may take many forms, any form that allows the instructions for that instance to operate on the test and measurement instrument. Examples may include something like a virtual machine, or a container. In virtual machines, the software code that makes up the machine typically has dedicated amounts of processing power and/or time, memory, and storage that are apportioned from the physical components of a host computer, in this case the test and measurement instrument. When executed, the file, sometimes referred to as an image file, behaves like the actual instrument. Typically, the virtual machine is partitioned from the rest of the system so it cannot interfere with the instrument's primary operating system.

Another example of an implementation of an instance would be in a container. Containers offer another form of virtualization, in which the container includes all of the necessary elements to operate. These elements may include, but are not limited to, executables, binary code, libraries, and configuration files, and they operate on the physical CPU and memory components of the instrument, and any accessories, like cables to a DUT. The containers share access to the operating system, so they are typically not isolated like virtual machines.

These examples comprise possibilities of how the instances could be embodied. They are not intended to limit the scope of the claims in any way. Any method of operating the instance on a shared physical instrument may be used. The memory may comprise a local memory used in the instrument and may be sequestered, such as is most common with virtual machines, where each instance has its own memory partition, or the instances can share the memory. Sharing memory may involve a remote memory, such as a cloud-based memory/storage.

Once the user has configured the instance, the user can use it to interact the instrument. FIG. 3 shows a flowchart of one embodiment of a user employing an instance to operate the instrument. If the system has associated the configurations with users, when the user logs into the instrument at 60, or a service on the network that interacts with the instrument, the system locates the instance associated with that user. This may involve the instrument processor or processors accessing a database of information organized by the user name, etc. If more than one instance is associated with the user, the system may present the user with a list of options for the user to select. Once the instance is selected at 62, the one or more processors retrieves the instructions necessary to create the instance at 64. The instructions are then executed to operate the instance at 66.

These instructions may cause the processors to render a dynamic instance user interface for each connected user, configured according to the resources allocated to that user. The instance user interface may present the user with selections or other options that allow the user to control their instance. The instrument then operates such that, from the view of the user, the user has control of the instrument, and any DUTs, etc.

Figure 4:
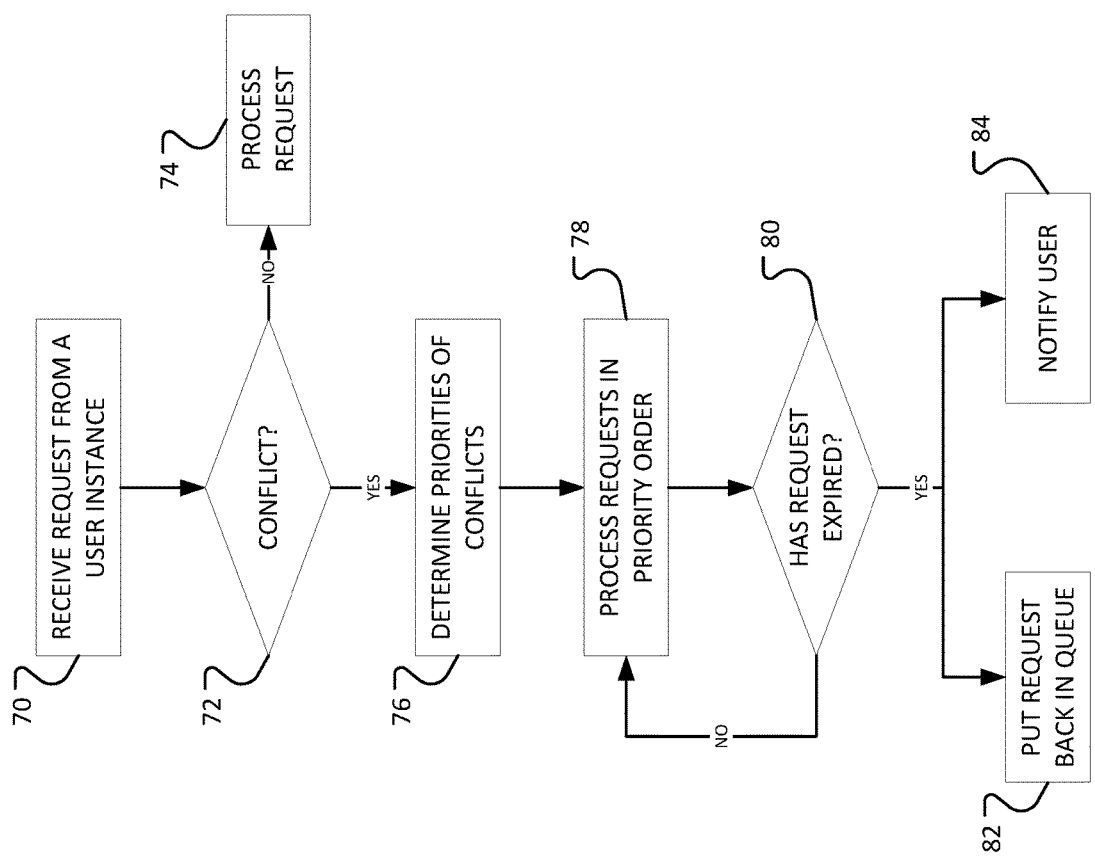
FIG. 4 shows a flowchart of an embodiment of a method of operating a test and measurement instrument that has multiple instances.

One issue that may arise with multiple instances running at once on the instrument occurs if two different instances try to access the same resource at the same time. The one or more processors on the instrument would need a collision avoidance engine to arbitrate hardware and resource settings to maximize each user's experiences. One method to accomplish this would be to monitor requests to determine if any of them conflict. While this process will operate for each instance, a method of an instance resolving the conflicts shown in FIG. 4, with the understanding that multiple instances may perform this type of process simultaneously.

A user instance generates a request, such as access to a particular channel on a probe connected to a DUT, received by the one or more processors at 70. At 72 the processer determines if there is a conflict. If no conflict, the one or more processors process the request at 74. If there is a conflict, the processor needs to determine the order of processing the requests at 76. As will be discussed in more detail below, the instrument may have an administrator mode that can assign priorities to each instance. In addition, the processor may raise or lower a priority for an instance, such as if the request has a time sensitive component that needs to be serviced first, even if the instance from which it comes has a lower priority.

Once the priorities are determined, the one or more processors process the request in order of their priorities at 78. As the processor works through the list of requests, other safeguards may exist that ensures that the request has not expired or gone stale. For example, a request may have a query about some set of data points, but by the time the request comes up for processing, those data points have changed past where the request needed them. In another example, the user may have attached a predetermined time by which the process needs to be process that expires. Ideally, the prioritization process may avoid these kinds of conflicts. If the request has expired at 80, depending on how the user has configured the instance, the request could just be returned to the queue at 82, if the request has way to be processed even if it had expired. Alternatively, the system could notify the user that the request was expired and ask for direction at 84. This provides one means of resolving conflicts for resources as they are utilized by multiple instances running simultaneously.

Other features and modifications may exist in the system. The user interfaces which may include the master user interface, and the instance user interface, may be graphical user interfaces, programmatic interfaces or an application programming interface. In addition to the configuration mode, where the user configures the user instances, and the operation mode, where the instances actually operate, there may be an administrator mode. The administrator mode may set permissions for access to resources for instances, or may allow the person in that mode to determine priorities for user instances, as well as defining conditions during which priorities can be raised or lowered.

Users may not have the ability to know if their instrument resources are adequate for testing, either because they cannot acquire the information needed. Another set of instructions such as another software package or options within the configuration of the instances could advise the administrator how likely resource conflicts would be based on foreknowledge of the tests or use cases, or using statistics of previous use.

In this manner, multiple users could simultaneously use the same instrument for different purposes.

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information, including cloud storage of data. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

EXAMPLES

Illustrative examples of the disclosed technologies are provided below. An embodiment of the technologies may include one or more, and any combination of, the examples described below.

Example 1 is a test and measurement instrument, comprising: one or more processors to execute code to cause the processors to: access a user instance of the test and measurement instrument; receive one or more requests from the user instance of the test and measurement instrument; determine any collisions between the one or more requests and any other requests for elements of the test and measurement instrument; resolve any collisions as necessary; perform one or more operations to fulfill the request; and display information resulting from the one or more operations on an instance user interface.

Example 2 is the test and measurement instrument of Example 1, the code further comprising code to cause the one or more processors to render the instance user interface on a user device remote from the test and measurement instrument.

Example 3 is the test and measurement instrument of either or Examples 1 or 2, the code further comprising code to cause the one or more processors to present a user with an instrument user interface, and in response to signals from the instrument user interface, define the user instance of the test instrument by assigning resources to the user instance.

Example 4 is the test and measurement instrument of Example 3, the code further comprising code to cause the one or more processors to generate an instance user interface for each instance in accordance with the resources assigned to the instance.

Example 5 is the test and measurement instrument of any of the Examples 1 through 4, the code further comprising code to cause the one or more processors to assign priorities to the instances.

Example 6 is the test and measurement instrument of Example 5, the code further comprising code to cause the one or more processors to prioritize requests for resources from any instances that are active simultaneously with the user instance based upon assigned priorities for all the instances.

Example 7 is the test and measurement instrument of any of Examples 1 through 6, the code further comprising code to cause the one or more processors to transfer data generated on the instrument for the user instance to a device remote from the test instrument designated in that instance.

Example 8 is the test and measurement instrument of any of Examples 1 through 7, the code further comprising code to cause the one or more processors to enter an administrator mode.

Example 9 is the test and measurement instrument of Example 8, wherein the code to cause the one or more processors to enter the administrator mode causes the one or more processors to perform at least one of assign priorities, switch operating modes of the test and measurement instrument, and reboot the test and measurement instrument.

Example 10 is the test and measurement instrument of any of Examples 1 through 9, further comprising one or either of a local memory that is one of sequestered, shared or combination of both, or a memory remote from the test and measurement instrument.

Example 11 is the test and measurement instrument of any of Examples 1 through 10, wherein the code to cause the one or more processors to manage requests causes the one or more processors to: identify that a request from the user instance conflicts with at least one other request from other instances; determine a priority of each request; queue the requests in order of priority; and respond to the requests in order until all requests have been processed.

Example 12 is the test and measurement instrument of Example 11, wherein the code that causes the one or more processors to respond to the requests comprises code that causes the one or more processors to: determine that request in the queue has had a predetermined time elapse; and resubmit the request.

Example 13 is the test and measurement instrument of Example 11, wherein the code that causes the one or more processors to resubmit the request operates either in response to a user of the user instance requesting the request be resubmitted, or the one or more processors automatically resubmitting the request.

Example 14 is the test and measurement instrument of any of Examples of 1 through 13, wherein the test and measurement instrument is one of either a single test and measurement instrument, or a conglomerate test and measurement instrument.

Example 15 is the test and measurement instrument of any of Examples of 1 through 14, wherein one or more of the instrument user interface and the instance user interface is one of graphical, programmatic or an application programming interface.

Example 16 is the test and measurement instrument of any Examples 1 through 15, wherein the instrument user interface is configured to interact with one of either an automated system or a machine learning system.

Example 17 is method of configuring one or more instances in a test and measurement instrument, comprising: rendering a master user interface on a user device; receiving, through master user interface, signals that provide configuration information for each user instance, associating each user instance with a particular user or group of users, converting the configuration information for each user instance into instructions to be executed by one or more processors to allocate resources in the test and measurement instrument for each user instance, and storing the instructions for each user instance in a memory.

Example 18 is the method of Example 17, wherein converting the configuration information into instructions for each user instance comprises one of creating a virtual machine for each user instance or creating a container for each user instance.

Example 19 is the method of either of Examples 17 or 18, further comprising: receiving authentication information for a user; determining a user instance associated with that user; accessing the memory to retrieve the instructions for the user instance; and executing the instructions as an instance on the test and measurement device.

Example 20 is a method of operating a test and measurement instrument, comprising: rendering an instance user interface on a user device remote from the test and measurement instrument; receiving one or more requests through the instance user interface; determining any collisions between the one or more requests and any other requests for elements of the test and measurement instrument; resolving any collisions as necessary; performing one or more operations to fulfill the request; and displaying information resulting from the one or more operations on the instance user interface.

Example 21 is the method of Example 20, wherein determining any collisions comprises determining if the one or more requests involve access to at least one element of the test and measurement instrument that is busy with another instance.

Example 22 is the method of either of Examples 20 or 21, wherein resolving any collisions comprises queueing the one or more requests and other requests for the elements in one of either priority order or based on a time received.

Example 23 is the method of any of Examples 20 through 22, wherein performing one or more operations comprises one or more of: generating a waveform to apply to a device under test; gathering data from a device under test; gathering waveform data; reconfiguring the test and measurement instrument; and reconfiguring a device under test.

Although specific aspects of the disclosure have been illustrated and described for purposes of illustration, it will be understood that various modifications may be made without departing from the spirit and scope of the disclosure. Accordingly, the disclosure should not be limited except as by the appended claims.

The invention claimed is:

1. A test and measurement instrument, comprising:
one or more processors to execute code to cause the processors to:
access a user instance of the test and measurement instrument, the user instance including a configuration of the test and measurement instrument for interaction with a device under test (DUT), the configuration including a set of resources and triggers that cause the instrument to behave in particular ways;
receive one or more requests from the user instance of the test and measurement instrument for at least one resource of the test and measurement instrument;
determine any collisions between the one or more requests and any other requests for resources of the test and measurement instrument;
resolve any collisions as necessary;
perform one or more operations using the at least one resource to fulfill the request; and
display information resulting from the one or more operations on an instance user interface.

2. The test and measurement instrument as claimed in claim 1, the code further comprising code to cause the one or more processors to render the instance user interface on a user device remote from the test and measurement instrument.

3. The test and measurement instrument as claimed in claim 1, the code further comprising code to cause the one or more processors to present a user with an instrument user interface, and in response to signals from the instrument user interface, define the user instance of the test instrument by assigning resources to the user instance.

4. The test and measurement instrument as claimed in claim 3, the code further comprising code to cause the one or more processors to generate an instance user interface for each instance in accordance with the resources assigned to the instance.

5. The test and measurement instrument as claimed in claim 1, the code further comprising code to cause the one or more processors to assign priorities to the instances.

6. The test and measurement instrument as claimed in claim 5, the code further comprising code to cause the one or more processors to prioritize requests for resources from any instances that are active simultaneously with the user instance based upon assigned priorities for all the instances.

7. The test and measurement instrument as claimed in claim 1, the code further comprising code to cause the one or more processors to transfer data generated on the instrument for the user instance to a device remote from the test instrument designated in that instance.

8. The test and measurement instrument as claimed in claim 1, the code further comprising code to cause the one or more processors to enter an administrator mode.

9. The test and measurement instrument as claimed in claim 8, wherein the code to cause the one or more processors to enter the administrator mode causes the one or more processors to perform at least one of assign priorities, switch operating modes of the test and measurement instrument, and reboot the test and measurement instrument.

10. The test and measurement instrument as claimed in claim 1, further comprising one of either a local memory that is sequestered, shared or combination of both, or a memory remote from the test and measurement instrument.

11. The test and measurement instrument as claimed in claim 1, wherein the code to cause the one or more processors to manage requests causes the one or more processors to:
identify that a request from the user instance conflicts with at least one other request from other instances;
determine a priority of each request;
queue the requests in order of priority; and
respond to the requests in order until all requests have been processed.

12. The test and measurement instrument as claimed in claim 1, wherein the test and measurement instrument is one of either a single test and measurement instrument, or a conglomerate test and measurement instrument.

13. The test and measurement instrument as claimed in claim 1, wherein one or more of the instrument user interfaces and the instance user interface is one of graphical, programmatic or an application programming interface.

14. The test and measurement instrument as claimed in claim 1, wherein the instrument user interface is configured to interact with one of either an automated system or a machine learning system.

15. A method of configuring one or more instances in a test and measurement instrument, comprising:
rendering a master user interface on a user device;
receiving, through the master user interface, signals that provide configuration information for each user instance, each user instance including a configuration for the test and measurement instrument for interaction with a device under test including a set of resources and triggers that cause the instrument to behave in particular ways;
associating each user instance with a particular user or group of users; and
converting the configuration information for each user instance into instructions to be executed by one or more processors to allocate resources in the test and measurement instrument for each instance; and
storing the instructions in a memory.

16. The method as claimed in claim 15, wherein converting the configuration information into instructions for each instance comprises one of creating a virtual machine for each instance or creating a container for each instance.

17. The method as claimed in claim 15, further comprising:
receiving authentication information for a user;
determining a user instance associated with that user;
accessing the memory to retrieve the instructions for the user instance; and
executing the instructions as an instance on the test and measurement device.

18. A method of operating a test and measurement instrument, comprising:
rendering an instance user interface on a user device remote from the test and measurement instrument, the instance including a configuration for the test and measurement device, the configuration including a set of resources and triggers that cause the instrument to behave in particular ways;

receiving one or more requests for resources on the test and measurement instrument through the instance user interface;

determining any collisions between the one or more requests and any other requests for at least one resource of the test and measurement instrument;

resolving any collisions as necessary;

performing one or more operations using the at least one resource to fulfill the request; and displaying information resulting from the one or more operations on the instance user interface.

19. The method as claimed in claim 18, wherein determining any collisions comprises determining if the one or more requests involve access to at least one resource of the test and measurement instrument that is busy with another instance.

20. The method as claimed in claim 18, wherein resolving any collisions comprises queueing the one or more requests and other requests for the resources in one of either priority order or based on a time received.

* * * * *